United States Patent [19]

Randall

[11] Patent Number: 4,827,138

[45] Date of Patent: May 2, 1989

[54] FILLED GRID MASK

[75] Inventor: John N. Randall, Richardson, Tex.

[73] Assignee: Texas Instruments Incorporated, Dallas, Tex.

[21] Appl. No.: 160,610

[22] Filed: Feb. 26, 1988

[51] Int. Cl.[4] ............................................. H01J 37/317
[52] U.S. Cl. ........................... 250/492.2 R; 250/505.1; 378/35; 430/5
[58] Field of Search ............. 250/492.21, 492.2, 505.1; 378/35; 430/5

[56] References Cited

U.S. PATENT DOCUMENTS 4,451,544 5/1988 Kawabuchi ............................ 430/5
4,647,517 3/1987 Hersener et al. ...................... 430/5

Primary Examiner—Jack I. Berman
Attorney, Agent, or Firm—George L. Craig; James T. Comfort; Melvin Sharp

[57] ABSTRACT

A mask (38), which is particularly useful in parallel-printing ion beam lithography because of its dimensional stability, is disclosed. The mask (38) represents a relatively rigid screen (22) constructed from a relatively rigid material, such as monocrystalline silicon, with meshes (28) formed through the screen (22) over the entire area of the screen (22). The preferred embodiment applies a less rigid filler material (34) into the meshes (28) over the entire area of the screen (22), then removes the filler material (34) from transmissive areas (42) of the mask (38).

18 Claims, 2 Drawing Sheets

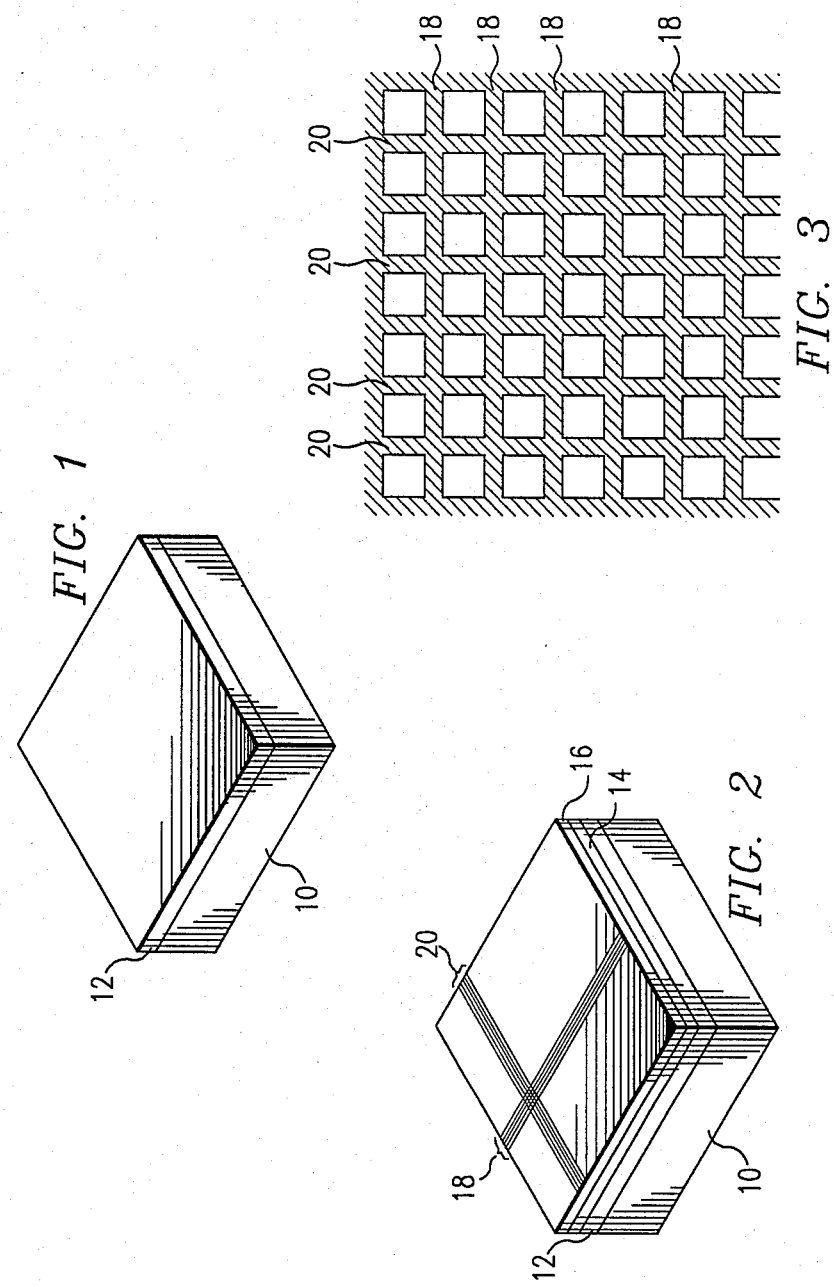

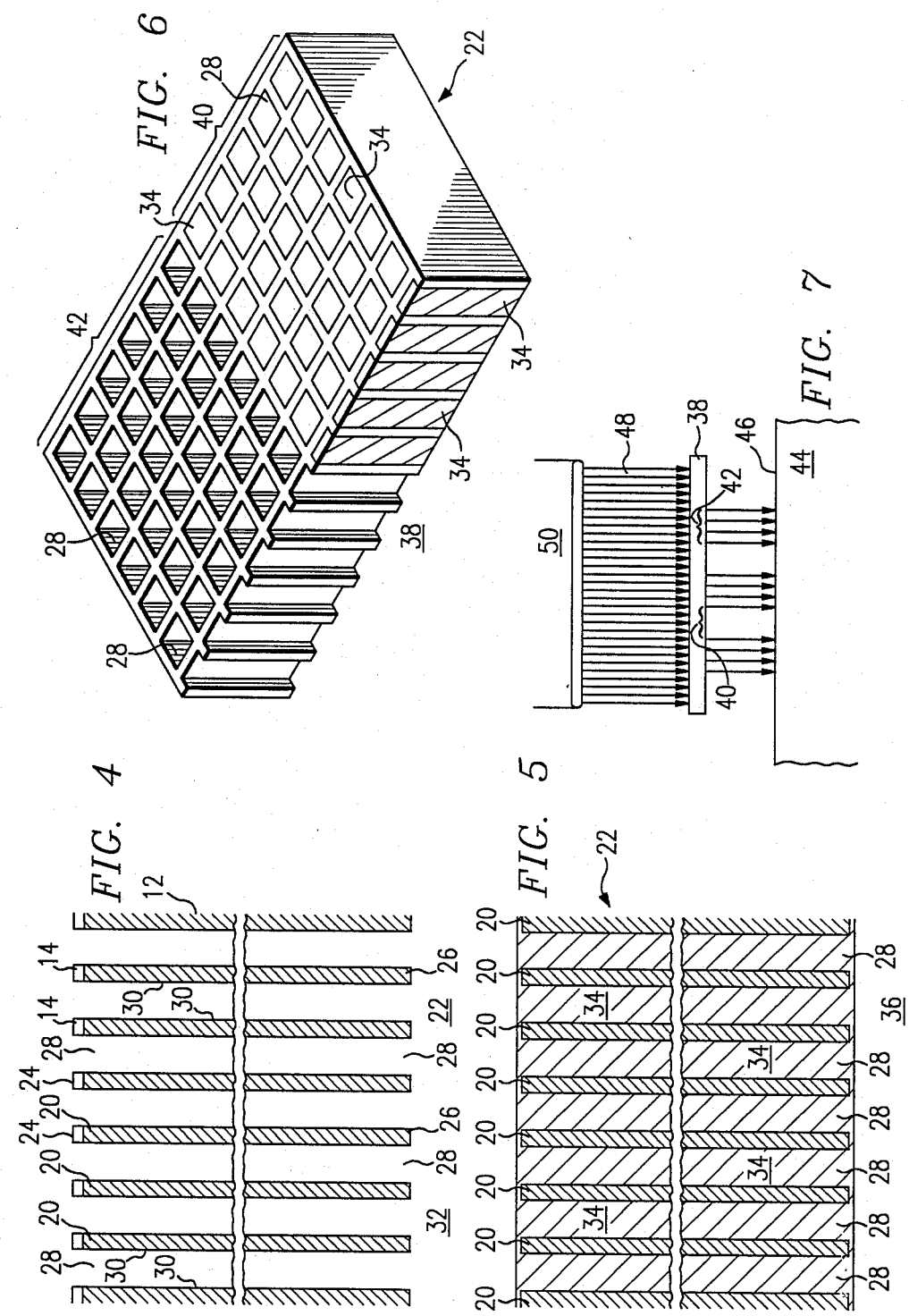

FILLED GRID MASK

TECHNICAL FIELD OF THE INVENTION

The present invention generally relates to lithographic techniques used in the fabrication of integrated circuits. More specifically, the present invention relates to masks which are used in connection with the parallel-printing of patterns on integrated circuits.

BACKGROUND OF THE INVENTION

Manufacturers of integrated circuits desire lithographic techniques which achieve high resolution printed patterns. One conventional lithographic technique is photolithography. However, printed patterns produced by current conventional photolithographic techniques achieve sub-micron resolution only with great difficulty because the natural phenomenon of diffraction causes a poor image quality and a small depth of focus.

Other technologies have been developed which improve upon the resolution achievable by photolithographic techniques. For example, X-ray lithography can achieve sub-micron resolutions. However, X-ray lithography is particularly expensive and suffers from problems related to generating X-rays with sufficient brightness to effectively expose a resist.

Electron beam lithography, when used in a serial writing mode, also improves upon the resolution attainable with photolithographic techniques. However, this technique is too slow for practical use in volume production. While parallel-printing with electron beam lithography is capable of high resolution, it has critical dimension control problems due to a proximity effect inherent in the electron beam process. This proximity effect may be corrected with local dose variation in the serial writing mode, but the problem is difficult to control when parallel-printing.

Ion beam lithography is another technique. Ion beam lithography does not suffer from diffraction effects such are as experienced in photolithography. Additionally, ion beam lithography does not suffer from a proximity effect, such as is experienced in parallel electron beam lithography. Moreover, sources for generating highly collimated high energy ion beams are commercially available. Such sources typically cost mush less than the brightest X-ray sources. Moreover, such sources expose a resist more effectively than the brightest of currently available X-ray sources.

However, ion beam lithography suffers from problems related to providing suitable masks for use in parallel-printing operations. Ion beams are easily blocked. Almost any solid material having a thickness of greater than one micron will successfully block the transmission of a high energy ion beam. Accordingly, masks used in ion beam lithography either have voids or extremely thin sections of material in transmissive areas of the mask.

When a mask used in ion beam lithography utilizes thin materials in the transmissive areas of the mask, an undesirable consequence results. Due to nuclear scattering effects, this type of mask tends to cause a highly collimated ion beam to diverge. In general, masks are spaced apart from a surface upon which a pattern is being printed. The spacing prevents damage from occurring to the surface or to the mask. Due to this spacing and the divergence caused by such a mask, highly precise printed features are not obtainable.

The use of voids in transmissive areas of a mask is therefore desirable because a highly collimated ion beam passing through a void in a mask remains highly collimated. However, many patterns are impossible to achieve using simple voids for the transmissive areas of the mask. For example, a doughnut-shaped transmissive area would leave no mechanical support for a nontransmissive "doughnut hole". Consequently, such a shape cannot be printed using a simple void for the transmissive area. Moreover, many structures which are physically possible to construct using void transmissive areas are too dimensionally unstable to be of practical value. In other words, some solid portions of the mask cannot be forced to maintain a precise position relative to other solid portions of the mask.

To solve the problems of void transmissive areas in ion beam masks, two conventional solutions are known. One solution utilizes multiple, complementary, stencil-type patterns which are used in multiple, sequential, registration and exposure steps to achieve a single printed pattern. Another solution utilizes a grid, such as a net, screen, or the like for the transmissive areas of the mask. These two solutions tend to suffer serious drawbacks when used in ion beam lithography. In particular, the multiple, complementary stencil-type mask technique suffers from excessive complication caused by the multiple exposure steps and the multiple registrations of masks. Both solutions suffer from excessive complication in the fabrication of the mask. Moreover, both solutions suffer from a diminished dimensional stability caused both during mask fabrication and as a result of mask heating during the exposure step.

Tensile stress is required in a material from which a mask is fabricated to keep the mask smooth and flat in order to minimize distortion. Stress is relieved wherever voids or grids are formed. The non-uniformity of a printed pattern causes the stress relief to be greater in some areas than others. Consequently, the pattern distorts in an attempt to equalize non-uniformities in stress.

In addition, during the exposure step ion beam radiation which is not transmitted through the mask is absorbed by the mask. Thus, the temperature of the mask increases during the exposure step. The heating of the mask relieves some of the tensile stress of the mask and causes solid portions of the mask to expand. Consequently, nothing prevents the temperature increases from causing the solid portions of the mask to expand in the vicinity of the boundaries between the solid and void areas. This expansion diminishes the precision otherwise achievable using ion beam radiation.

Accordingly, a mask is needed which is dimensionally stable throughout fabrication and use. In addition, such a mask needs to utilize void transmissive areas to minimize ion beam divergence causable by nuclear scattering.

SUMMARY OF THE INVENTION

Accordingly, it is an advantage of the present invention that an improved mask is provided which remains dimensionally stable when used in connection with ion beam lithography.

Another advantage of the present invention is that an improved mask is provided which utilizes voids for transmissive areas of the mask so that no significant beam divergence results from nuclear scattering.

Yet another advantage of the present invention is that an improved mask is provided which need not be excessively complicated to fabricate.

The above and other advantages of the present invention are carried out in one form by a first material formed into a generally planar membrane which has top and bottom surfaces. The membrane additionally contains a multiplicity of openings which extend between the top and bottom surfaces. Walls between each of the openings and the first material are substantially straight, and a substantial portion of these walls extend parallel to the direction from which radiation impinges upon the mask. A second material is located within some of the openings. This second material is applied to the openings so that it substantially blocks passage of the radiation.

BRIEF DESCRIPTION OF THE DRAWINGS

A more complete understanding of the present invention may be derived by referring to the detailed description and claims when considered in connection with the figures, wherein like reference numbers refer to similar items, and:

FIG. 1 schematically illustrates a substrate and epitaxial layer used in the fabrication of the present invention;

FIG. 2 schematically illustrates additional layers added to the structure of FIG. 1 in the present invention;

FIG. 3 schematically illustrates a pattern formed on the structure of the present invention depicted in FIG. 2;

FIG. 4 schematically illustrates the results of etching steps performed on the structure of the present invention depicted by FIGS. 2-3;

FIG. 5 schematically illustrates the addition of a filler to the structure of the present invention illustrated by FIG. 4;

FIG. 6 schematically illustrates the formation of a pattern in the structure of the present invention depicted by FIG. 5; and FIG. 7 illustrates the present invention in an ion beam lithography parallel-printing process.

DETAILED DESCRIPTION OF THE PREFERRED EMBODIMENTS

The present invention relates to a mask which is useful in the parallel-printing of patterns on integrated circuits. Parallel-printing refers to both proximity printing and projection printing. In proximity printing the mask resides very close to a surface upon which a pattern is being printed, and a 1:1 correspondence occurs between the mask pattern and printed pattern. In projection printing an image is projected by a mask which resides far away from a surface upon which a pattern is being printed, and some reduction between mask and printed patterns usually occurs. In addition, the mask of the present invention is intended for use with ion beam lithography. However, those skilled in the art will recognize that the present invention is not limited to use in connection with ion beam lithography or the printing of patterns on integrated circuits. For example, nothing prohibits the teaching herein from being applied to electron beam lithography, photolithography, X-ray lithography, or the like. Additionally, nothing prohibits the teaching provided herein from being applied to any type of printing, whether such printing occurs on an integrated circuit device or other structure.

FIG. 1 shows a substrate 10 which is used in constructing the mask of the present invention. The preferred embodiment of the present invention contemplates the use of a silicon crystalline lattice as a material from which the mask is constructed. Accordingly, in the preferred embodiment substrate 10 represents a monocrystalline silicon substrate, such as those conventionally used in the fabrication of integrated circuits. The crystalline orientation of substrate 10 is unimportant in the present invention, but may be chosen by those skilled in the art to satisfy various application-specific requirements. Moreover, the thickness of substrate 10 is not critical in the present invention, but is preferably as thin as reasonably possible. The preferred embodiment of the present invention contemplates the area of the mask being up to approximately one $cm^2$. Accordingly, the area of substrate 10 is larger than one $cm^2$.

FIG. 1 additionally illustrates growth of an epitaxial layer 12 upon a surface of substrate 10. In the preferred embodiment, epitaxial layer 12 is grown in a high concentration of boron, such as 5E19 atoms/$cm^3$. The boron atoms become substitutionally incorporated in the crystalline lattice of epitaxial layer 12. Since boron atoms are smaller than silicon atoms, the boron causes internal tensile stress in the lattice of epitaxial layer 12. In addition, the boron-doped epitaxial layer 12 provides an etch stop for differentiating epitaxial layer 12 from substrate 10 in a later-occurring step which removes substrate 10 from epitaxial layer 12. The growth of epitaxial layer 12 produces a crystalline lattice which forms a generally planar membrane overlying substrate 10.

The thickness of epitaxial layer 12 is sufficient to block the transmission of ion beam radiation therethrough. The present invention contemplates the use of ion beam radiation at energies of less than approximately 200 keV. Thus, a minimum thickness of approximately two microns of epitaxial layer 12 will sufficiently block this radiation.

On the other hand, the maximum thickness of epitaxial layer 12 depends upon limits imposed by an ability to etch vertical openings through epitaxial layer 12. A later-occurring etching step will etch such holes through the entire thickness of layer 12. Current etching technologies limit the distances over which vertical openings may be etched. Thus, epitaxial layer 12 is preferably sufficiently thin so that such vertical openings may be successfully etched through epitaxial layer 12. Nevertheless, epitaxial layer 12 is preferably as thick as possible within these constraints so that a resulting mask constructed of epitaxial layer 12 will be as strong as possible and have as great a capacity as possible to tolerate heating in an ion beam lithography process. Specifically, layer 12 is advantageously greater than two microns thick and most preferably four to eight microns thick.

FIG. 2 schematically illustrates the addition of layers 14 and 16 overlying epitaxial layer 12. Layer 14 represents a protecting layer. An oxide which is grown overlying epitaxial layer 12 or an oxide, metal, or nitride layer which is deposited using conventional chemical vapor deposition techniques may serve as protecting layer 14. Layer 16 represents a conventional resist coat which is applied overlying layer 14. Layer 14 prevents a later-occurring etch step from harming epitaxial layer 12.

Resist layer 16 is next exposed to radiation so that a grid-like pattern results. FIG. 3 illustrates a small portion of the grid. In the preferred embodiment, the grid is formed by exposing small square areas which are spaced apart from one another by length lines 18 and width lines 20. Length lines 18 extend perpendicular to width lines 20.

The square shapes illustrated in FIG. 3 are preferred in the construction of this grid-like pattern. In a later-occurring etch step, these squares are formed into openings which extend through epitaxial layer 12 (see FIG. 2). These openings tend to relieve a portion of the internal tensile stress present in epitaxial layer 12. However, the use of squares for the grid pattern uniformly relieves this stress in both the length and width dimensions over the entire surface of epitaxial layer 12. Since the stress is relieved uniformally, fabrication induced dimensional distortions are minimized. In addition, the square pattern shown in FIG. 3 is preferable because radiation will be transmitted through the openings when the mask is used in a printing process. Consequently, the use of squares as opposed to a nonsymetrical shape permits equivalent resolution in both length and width dimensions of a pattern to be printed. Nevertheless, those skilled in the art will recognize that other symmetrical geometrical shapes than the squares shown in FIG. 3, such as circles or hexagons, may be utilized in a regular pattern with only a minor degradation in performance.

Moreover, the preferred embodiment contemplates a high resolution pattern. For example, the preferred embodiment utilizes length and width lines 18 and 20, respectively, of approximately 800 angstroms in thickness and spaced approximately 3,000 angstroms apart. Since a resulting mask is approximately one cm$^2$, the above-discussed dimensions require exposing millions of squares over the entire surface of layer 16. FIG. 2 shows only a few of the length lines 18 and width lines 20.

Electron beam lithography may be used in a serial writing mode to achieve the high resolution contemplated by the preferred embodiment. The use of electron beam lithography to expose this large quantity of squares may require a large amount of time. However, once a first mask has been made, the first mask may serve as a master for all future masks. These future masks may be exposed using ion beam lithography as described in connection with the present invention. Of course, those skilled in the art may advantageously design other techniques for patterning the above-described high resolution pattern on surface 16.

After the entire surface of layer 16 has been exposed, a developing step removes the exposed portions of layer 16. Next, an etching step removes portions of layer 14 which have become uncovered by the removal of portions of layer 16. Then, another etching step vertically etches through the entire thickness of epitaxial layer 12 in the areas defined by the removed portions of layer 14. The preferred embodiment contemplates the use of conventional ion beam or reactive ion etching techniques to perform this vertical etching.

After etching through layer 12, an etch-back step is used to entirely etch away substrate 10 from epitaxial layer 12 underneath the portion of epitaxial layer 12 which serves as a mask after subsequent processing steps (discussed below). Consequently, a silicon frame (not shown) may remain surrouding this mask. As discussed above, the boron doping in epitaxial layer 12 provides an etch stop which conventional etching techniques exploit to differentiate substrate 10 from epitaxial layer 12.

FIG. 4 shows a side view of the structure which results after this etch-back step. This resulting structure forms a screen 22 comprised of the material from epitaxial layer 12 and protection layer 14. Screen 22 represents a substantially planar membrane which has a top surface 24 opposing a bottom surface 26. In addition, the fabrication steps discussed above cause top surface 24 to substantially parallel bottom surface 26. Moreover, screen 22 contains a multiplicity of openings or meshes 28 therein. Meshes 28 extend through the entire thickness of screen 22 from top surface 24 to bottom surface 26. Meshes 28 are additionally characterized as having mesh walls 30 which are substantially straight and which extend substantially perpendicular to top and bottom surfaces 24 and 26.

The straightness of walls 30 permits width lines 20 to be as long as possible throughout the entire thickness of screen 22. Likewise, length lines 18 (see FIG. 3) are as wide as possible throughout the entire thickness of screen 22. Consequently, the overall strength of screen 22 is maximized. In addition, when screen 22 is formed into a mask and used in a parallel-printing process, radiation is transmitted through the mask at openings or meshes 28. This radiation may be transmitted through materials which are less than one micron thick. Consequently, the straightness of opening walls 30 prohibits radiation from impinging upon any sections of screen 22 which are less than one micron in thickness.

The resulting structure depicted in FIG. 4 may advantageously serve as a master mask 32 used for the fabrication of other masks identical to screen 22 at the present stage of fabrication. However, the present invention additionally contemplates the use of screen 22 in connection with various unique patterns which may be programmed into a mask using the steps which are described below.

FIG. 5 shows the addition of a filler material 34 within meshes 28 of screen 22. The specific material used as filler material 34 is not critical to the operation of the present invention. However, filler material 34 is chosen to have benign mechanical properties when compared to the mechanical properties of the silicon crystalline lattice structure of width lines 20 and length lines 18 (see FIG. 3). In addition, filler material 34 is selected so that a later-occurring etch step is highly selective to filler material 34 compared to length lines 18 (see FIG. 3) and width lines 20. The benign mechanical properties cause filler 34 to have little or no influence on the overall mechanical properties of screen 22. Thus, filler 34 is substantially less rigid than the silicon crystalline lattice of length lines 18 (see FIG. 3) and width lines 20 and exerts substantially no influence on the internal stress of screen 22 when subjected to radiation. The preferred embodiment contemplates the use of various organic polymers for filler material 34. In particular, a resist material which is exposable by being subjected to electron beam radiation is particularly advantageous for use as filler material 34, so long as such a resist exhibits the above-mentioned benign mechanical properties.

The present invention contemplates any one of several different techniques for the application of filler material 34 into meshes 28 of screen 22. Filler material 34 need not entirely fill meshes 28 from top surface 24 through the entire thickness of screen 22 to bottom surface 26. As discussed above, screen 22 is advantageously greater than two microns thick and most preferably four to eight microns thick. Furthermore, approximately one micron of any solid material will effectively block passage of ion beam radiation. Accordingly, a sufficient quantity of filler material 34 is applied into meshes 28 of screen 22 so that a thickness of at least one micron of filler 34 is achieved within meshes 28.

Filler 34 may be spun on using conventional spin application techniques. If a filler material 34 is chosen with a sufficiently low viscosity, then capillary action causes filler 34 to be sucked into meshes 28. Alternatively, filler 34 may be applied using chemical vapor deposition techniques. Regardless of the application technique, filler 34 is applied over the entire surface of screen 22. Consequently, at this point in the fabrication, screen 22 and filler 34 together form a mask blank 36 which may be mass produced so that particular unique patterns may be later programmed into mask blank 36 by removing filler material 34 from selected portions of mask blank 36. Those who wish to fabricate a mask for use in a specific application, need only acquire a mask blank 36 which may be mass produced to the stage of fabrication shown in FIG. 5. Then, mask blank 36 may be programmed to contain a particular unique pattern using the relatively uncomplicated steps discussed below.

FIG. 6 shows the removal of filler material 34 from selected portions of screen 22 to form a programmed mask 38 which is specifically adapted for a unique application. As discussed above, a resist material may advantageously serve as filler 34. Consequently, with this type of filler 34, programmed mask 38 may be produced by exposing a particular pattern on mask blank 36 (see FIG. 5) using electron beam lithography. The techniques for exposing such a pattern are conventional, and are not discussed further herein. Next, filler 34 is removed from selected portions of mask blank 36 by simply developing the exposed portions of filler 34. Of course, development of a resist does not generally harm the silicon from which screen 22 is constructed. After development of the exposed portions of filler 34, a few hundred angstroms of a protective coat, such as an oxide or nitride, may advantageously be applied over the entire surface of programmed mask 38 to stabilize the remaining resist.

If a material which is not a resist is utilized for filler 34, then a thin metal layer (not shown) may be applied overlying the entire surface of mask blank 36 (see FIG. 5). Next, a resist coat (not shown) may be applied overlying the thin metal layer, and the resist coat may be exposed using electron beam lithography as discussed above. Exposed portions of the resist may be removed, an etching step may transfer this pattern to the metal, and a subsequent etching step, typically an oxygen plasma etching step when an organic polymer is used for filler 34, is used to remove filler 34 from selected portions of mask blank 36. The etchant used in this step is selective to filler 34 relative to screen 22 so that screen 22 is not harmed.

A resulting programmed mask 38 contains an opaque area 40 in which filler material 34 has not been removed from meshes 28 in screen 22. Programmed mask 38 also contains a transmissive area 42 in which filler material 34 has been removed from meshes 28 located at selected portions of screen 22. Of course, those skilled in the art will recognize that over the entire area of a mask 36 a complicated pattern may be formed of a multiplicity of opague areas 40 and transmissive areas 42.

In programmed mask 38, the tensile stress of mask 38 tends to be uniformly distributed throughout the entire area of mask 38. This occurs because screen 22, without filler 34, contains a uniform pattern throughout the entire surface of screen 22. The properties of filler 34 are chosen so that filler 34 does not significantly increase or decrease the stress of screen 22. As a consequence, the presence or absence of filler material 34 has little influence over the overall stress and distribution of stress within programmed mask 38. Consequently, dimensional distortions caused by fabrication and heating are minimized.

FIG. 7 shows the use of programmed mask 38 in an ion beam lithography, proximity, parallel-printing process. Structure 44 in FIG. 7 represents an integrated circuit. Structure 44 has a surface 46 upon which a desired pattern is to be printed. Programmed mask 38 is spaced apart from surface 46 of structure 44 so that damage to surface 46 or to mask 38 is minimized in the printing process. Mask 38 selectively transmits radiation impinging thereon. In other words, transmissive areas 42 of mask 38 permit transmission of radiation through mask 38 while opague areas 40 of mask 38 prohibit transmission of radiation through mask 38.

Radiation 48 represents a highly collimated ion beam of preferably hydrogen ions which is distributed over the entire area of mask 38. In the preferred embodiment, radiation 48 impinges upon mask 38 from a direction which is substantially perpendicular to the plane of mask 38 at an energy of less than approximately 200 keV. Radiation 48 is provided by a radiation source 50. Radiation source 50 is similar to ion beam sources used in ion beam implantation technology, which is well known to those skilled in the art and is not discussed further herein. The activation of radiation source 50 causes source 50 to produce radiation 48 and thereby expose selected portions of surface 46 to this radiation.

Since transmissive areas 42 of mask 38 contain a grid structure, this grid structure may be transferred to surface 46 of structure 44 unless specific steps are taken to remove the grid lines. The grid lines are formed by length and width lines 18 and 20 (see FIG. 3) which are approximately only 800 angstroms wide in the preferred embodiment. Consequently, the grid pattern on surface 46 which must be removed consists of perpendicular lines approximately 800 angstroms wide. This grid may be removed by slightly decollimating radiation 48 produced by radiation source 50. The slight decollimazation causes a portion of radiation 48 to impinge upon mask 38 from a variety of angles which differ slightly from the perpendicular angle discussed above. Since mask 38 is spaced apart from surface 46, this variety of angles causes radiation transmitted through transmissive areas 42 of mask 38 to expose the grid lines projected on surface 46.

Alternatively, these projected grid lines may be removed by slightly rocking one of mask 38, structure 44, or radiation source 50 relative to the other two. This slight rocking may be performed in a well controlled technique so that ion beam radiation impinging upon surface 46 of structure 44 tends to be displaced at least approximately 400 angstroms from its position when none of mask 38, radiation source 50, or structure 44 are moved relative to the other. This slight rocking technique is preferred over the decollimation technique because it is more easily controlled and will not impair the resolution achievable using a mask 38 constructed according to the teaching of the present invention.

In summary, the present invention provides a dimensionally stable, programmed mask 38 for use in ion beam lithography. Mask 38 does not suffer from fabrication induced dimensional distortions because a uniform grid is formed in epitaxial layer 12, and the uniform grid relieves stress uniformly throughout the entire area of mask 38. Moreover, the heating of mask 38 which occurs during the parallel-printing process tends to cause a uniform stress change throughout mask 38. Since the stress change is uniform, opague areas 40 of mask 38 tend to maintain position relative to other opague areas 40 of mask 38. Since filler material 34 is much less rigid than screen 22 and is not confined, the heating of filler material 34 may cause filler material 34 to expand vertically and not affect stresses experienced by mask 38 in opague areas 40 of mask 38. Moreover, mask 38 is not complicated to fabricate when compared to other masks utilized in ion beam lithography. Those wishing to program a unique pattern into a mask may obtain a mask blank 36 and utilize conventional etching techniques to fabricate programmed mask 38 from mask blank 36. Moreover, mistakes in mask fabrication may be repaired using, for example, conventional ion beam deposition and/or etching techniques.

The foregoing description discusses preferred embodiments of the present invention which may be changed or modified without departing from the scope of the present invention. For example, screen 22 may be fabricated by removing substrate 10 from epitaxial layer 12 at an earlier stage in the fabrication of screen 22 than is described above. Moreover, substantially the same programmed mask 38 results whether opaque areas 40 are added to master mask 32 or transmissive areas 42 are removed from mask blank 36 as described above in connection with the preferred embodiment. These and other changes and modifications obvious to those skilled in the art are intended to be included within the scope of the present invention.

What is claimed is:

1. A mask for use in parallel-printing to selectively transmit radiation impinging thereon from a predetermined direction, said mask comprising:
    a first material configured as a generally planar membrane under tensile stress having top and bottom surfaces and having a uniformly spaced multiplicity of openings extending between said top and bottom surfaces, said openings having walls extending between and substantially normal to said top and bottom surfaces; and
    a second material located within selected ones of said openings, said first and said second materials substantially blocking passage of said radiation.

2. A mask as claimed in claim 1 wherein said radiation is ion radiation.

3. A mask as claimed in claim 1 wherein said first material is comprised of crystalline silicon.

4. A mask as claimed in claim 3 wherein said first material is additionally comprised of a substance which is substitutionally incorporated into a lattice of said crystalline silicon to create tensile stress within said lattice.

5. A mask as claimed in claim 4 wherein said substance is boron.

6. A mask as claimed in claim 1 wherein a cross section of each of said openings parallel to the planar membrane of said first material is approximately a square shape.

7. A mask as claimed in claim 1 wherein said second material is selectively etched relative to said first material using a predetermined etchant.

8. A mask as claimed in claim 1 wherein said second material supplies substantially no contributions to the mechanical properties of said membrane of said first material.

9. A mask as claimed in claim 1 wherein said second material is located within substantially all of said openings so that a predetermined mask pattern may be formed by removing said second material from a portion of said openings at predetermined locations on said mask which correspond to said predetermined mask pattern.

10. A mask for use in the parallel printing of patterns on integrated circuit devices so that ion beam radiation impinging thereon is selectively transmitted therethrough, said mask comprising:
    a planar screen having a multiplicity of meshes uniformly spaced apart by lines of a crystalline lattice and configured so that said meshes have mesh walls which are straight and extend substantially perpendicular to the plane of said screen and so that cross sections of said meshes taken parallel to the plane of said screen have an approximately square shape, said lines of said lattice being sufficiently thick to substantially block passage of said radiation therethrough; and
    a filler material which is less rigid than said lattice, which is located within at least a portion of said openings, and which substantially blocks passage of said radiation through said portion of meshes occupied by said filler material.

11. A mask as claimed in claim 10 wherein said lattice is comprised of silicon and boron, said boron being incorporated in said lattice to increase tensile stress of said lattice.

12. A method of selectively exposing predetermined portions of a surface to an exposing radiation, said method comprising the steps of:
    locating a screen fabricated from a first material between said surface and a source of said exposing radiation, said screen having meshes therein;
    filling at least a portion of said meshes with a second material so that said meshes which are not filled with said second material correspond to said predetermined portions of said surface; and
    activating said source of exposing radiation.

13. A method as claimed in claim 12 additionally including the steps of placing said screen in tensile stress.

14. A method as claimed in claim 13 wherein said placing step distributes the stress uniformly throughout said screen.

15. A method as claimed in claim 12 wherein said exposing radiation originates from a predetermined direction relative to said screen and the method additionally comprises the step of forming said screen so that mesh walls reside substantially parallel to said predetermined direction.

16. A method as claimed in claim 15 wherein said forming step includes the step of forming said mesh walls to be substantially straight and perpendicular between top and bottom surfaces of said screen.

17. A method as claimed in claim 12 wherein said radiating source produces a substantially collimated beam of radiation and said method additionally comprises the step of moving one of said radiation source, mask, and surface relative to the other two of said radiation source, mask, and surface so that radiation impinges upon said surface underlying lines of said first material which reside between unfilled meshes.

18. A method as claimed in claim 12 wherein said activating step produces ion beam radiation.

* * * * *